US012658729B2

(12) United States Patent
Han et al.

(10) Patent No.: US 12,658,729 B2
(45) Date of Patent: Jun. 16, 2026

(54) APPARATUS FOR DISCHARGING BATTERY IN CURRENT CONTROL METHOD

(71) Applicant: MAROO ON INC., Cheongju-Si (KR)

(72) Inventors: Yeon Soo Han, Cheongju-Si (KR); Eun Sung Shin, Hwaseong-Si (KR); Eui Seok Ye, Daegu (KR); Myeong Ji Moon, Cheongju-Si (KR); Hong Gyun Yu, Cheongju-Si (KR)

(73) Assignee: MAROO ON INC., Cheongju-Si (KR)

( * ) Notice: Subject to any disclaimer, the term of this patent is extended or adjusted under 35 U.S.C. 154(b) by 775 days.

(21) Appl. No.: 17/922,738

(22) PCT Filed: May 4, 2021

(86) PCT No.: PCT/KR2021/005610
§ 371 (c)(1),
(2) Date: Nov. 1, 2022

(87) PCT Pub. No.: WO2021/225357
PCT Pub. Date: Nov. 11, 2021

(65) Prior Publication Data
US 2023/0223779 A1     Jul. 13, 2023

(30) Foreign Application Priority Data
May 8, 2020     (KR) ......................... 10-2020-0055083

(51) Int. Cl.
*H02J 7/94*          (2026.01)
*G01R 31/382*        (2019.01)
(Continued)

(52) U.S. Cl.
CPC .............. *H02J 7/94* (2026.01); *G01R 31/382* (2019.01)

(58) Field of Classification Search
CPC .... H02J 7/00714; H02J 7/0047; H02J 7/0063; H02J 7/0069; H02J 7/0029;
(Continued)

(56) References Cited

U.S. PATENT DOCUMENTS 5,998,973 A      12/1999  Tsai
2011/0311844 A1*  12/2011  Han ...................... H02J 7/0069
429/49
(Continued)

FOREIGN PATENT DOCUMENTS

CN        104716703 A       6/2015
CN        110729521 A       1/2020
(Continued)

OTHER PUBLICATIONS

European Patent Office Extended European Search Report (EP 21 80 0472), corresponding to the subject matter of the present application. Date of Mailing: May 14, 2024.
(Continued)

*Primary Examiner* — Julian D Huffman
*Assistant Examiner* — Lisa Kotowski
(74) *Attorney, Agent, or Firm* — Kevin R. Erdman; Brannon Sowers & Craacraft PC

(57)                ABSTRACT

The present disclosure provides a current control-type battery discharging apparatus including: a plurality of power switches connected to one terminal of a battery; at least one current feedback control circuit configured to apply at least one control signal to the plurality of power switches; at least one current measurement resistor connected to the plurality of power switches and the other terminal of the battery; and a microprocessor configured to supply at least one reference signal to the at least one current feedback control circuit.

8 Claims, 2 Drawing Sheets

(51) Int. Cl.

| | |
|---|---|
| *H02J 7/00* | (2026.01) |
| *H02J 7/60* | (2026.01) |
| *H02J 7/80* | (2026.01) |
| *H02J 7/90* | (2026.01) |

(58) Field of Classification Search
CPC .. H02J 7/00712; H02J 7/0016; G01R 31/382;
G01R 31/3842; G01R 31/392; Y02E
60/10; H01M 10/44; B60L 58/16
USPC ........................................................ 320/139
See application file for complete search history.

(56) References Cited

U.S. PATENT DOCUMENTS

| | | | |
|---|---|---|---|
| 2015/0061601 A1* | 3/2015 | Hatanaka .............. | H01M 10/44 |
| | | | 320/136 |
| 2015/0162761 A1 | 6/2015 | Stanley et al. | |
| 2016/0079858 A1* | 3/2016 | Chen ...................... | H02M 1/00 |
| | | | 323/271 |
| 2016/0159243 A1* | 6/2016 | Park ...................... | B60L 3/0046 |
| | | | 320/136 |
| 2017/0264123 A1* | 9/2017 | Mulawski ............. | H02J 7/0014 |
| 2018/0358835 A1* | 12/2018 | Tian .................. | H01M 10/0525 |
| 2020/0006965 A1 | 1/2020 | Edelhauser et al. | |

FOREIGN PATENT DOCUMENTS

| | | |
|---|---|---|
| JP | 2009117317 A | 5/2009 |
| JP | 2015019461 A | 1/2015 |
| JP | 2019071701 A | 5/2019 |
| KR | 20180044750 A | 5/2018 |

OTHER PUBLICATIONS

China National Intellectual Property Administration, Chinese Office Action (CN202180032701.1), corresponding to the subject matter of the present application. Date of Mailing: May 23, 2025.

Park, Hey-ryun; International Search Report; PCT/KR2021/005610; Dated: Aug. 23, 2021; 4 pages.

* cited by examiner

APPARATUS FOR DISCHARGING BATTERY IN CURRENT CONTROL METHOD

BACKGROUND

1. Technical Field

The present disclosure relates to a current control-type battery discharging apparatus, and more specifically, to an independent current control-type battery discharging apparatus including a plurality of power switches and a plurality of current feedback control circuits.

2. Discussion of the Related Art

Generally, a vehicle using an internal combustion engine using gasoline or heavy oil as main fuel has a severe impact on the occurrence of pollution such as air pollution or the like. Accordingly, recently, in order to reduce the occurrence of pollution, much effort has been taken for development of an electric vehicle or a hybrid vehicle.

Specifically, the electric vehicle is a vehicle using a battery engine which operates by electric energy output from a battery, and uses a battery in which a plurality of chargeable and dischargeable battery cells are formed as one pack as a main power source, and thus has advantages of no exhaust gas and very little noise.

In order to secure electrical safety after use of the battery is completed, the battery should be removed from the vehicle in advance and then should be immersed in salt water to be discharged after removal, and in this salt water immersion discharging, there is a problem in that production and management of salt water are inconvenient, and additional equipment such as a large-capacity water tank, a hoist, a forklift, or the like is required during discharging, and thus workability is poor.

Further, there is a problem in that harmful gas and wastewater are generated during the discharging, and the battery is corroded by salt water, and thus a recycling value of the battery decreases after the discharging, and there is a problem in that this method is a discharging method using electrolysis, and thus the remaining electrical energy in the battery cannot be reused.

In addition, since a voltage of the battery cannot be measured during the salt water immersion discharging, there is a problem in that a discharging end time cannot be known, and a long time is taken for certain discharging.

SUMMARY

The present disclosure is directed to providing an independent current control-type battery discharging apparatus of which stability is improved and a lifespan is increased by respectively connecting a plurality of current feedback control circuits to a plurality of power switches to independently control the plurality of power switches.

The present disclosure provides a current control-type battery discharging apparatus including: a plurality of power switches connected to one terminal of a battery; at least one current feedback control circuit configured to apply at least one control signal to the plurality of power switches; at least one current measurement resistor connected to the plurality of power switches and the other terminal of the battery; and a microprocessor configured to supply at least one reference signal to the at least one current feedback control circuit.

Further, the at least one current feedback control circuit may transmit at least one measurement signal corresponding to discharging currents of the plurality of power switches to the microprocessor, and the microprocessor may transmit the at least one reference signal corresponding to the at least one measurement signal to the at least one current feedback control circuit.

In addition, the at least one current feedback control circuit may control the discharging currents of the plurality of power switches using the at least one control signal corresponding to the at least one reference signal.

In addition, the plurality of power switches may include first to nth power switches, the at least one current feedback control circuit may include first to nth current feedback control circuits respectively connected to the first to nth power switches, and the at least one current measurement resistor may include first to nth current measurement resistors respectively connected to the first to nth power switches.

In addition, the at least one control signal may include first to nth control signals respectively applied to the first to nth power switches, and the at least one reference signal may include first to nth reference signals respectively transmitted to the first to nth current feedback control circuits.

In addition, the current control-type battery discharging apparatus may further include a selection switch connected between the microprocessor and the first to nth current feedback control circuits.

In addition, the first to nth current feedback control circuits may transmit first to nth measurement signals corresponding to the discharging currents of the first to nth power switches to the microprocessor, the microprocessor may transmit the first to nth reference signals corresponding to the first to nth measurement signals and a selection signal to the selection switch, and the selection switch may respectively transmit the first to nth reference signals to the first to nth current feedback control circuits according to the selection signal.

In addition, the first to nth current feedback control circuits may respectively control the discharging currents of the first to nth power switches using the first to nth control signals corresponding to the first to nth reference signals.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Here, the present disclosure will be described with reference to the accompanying drawings.

Figure 1:
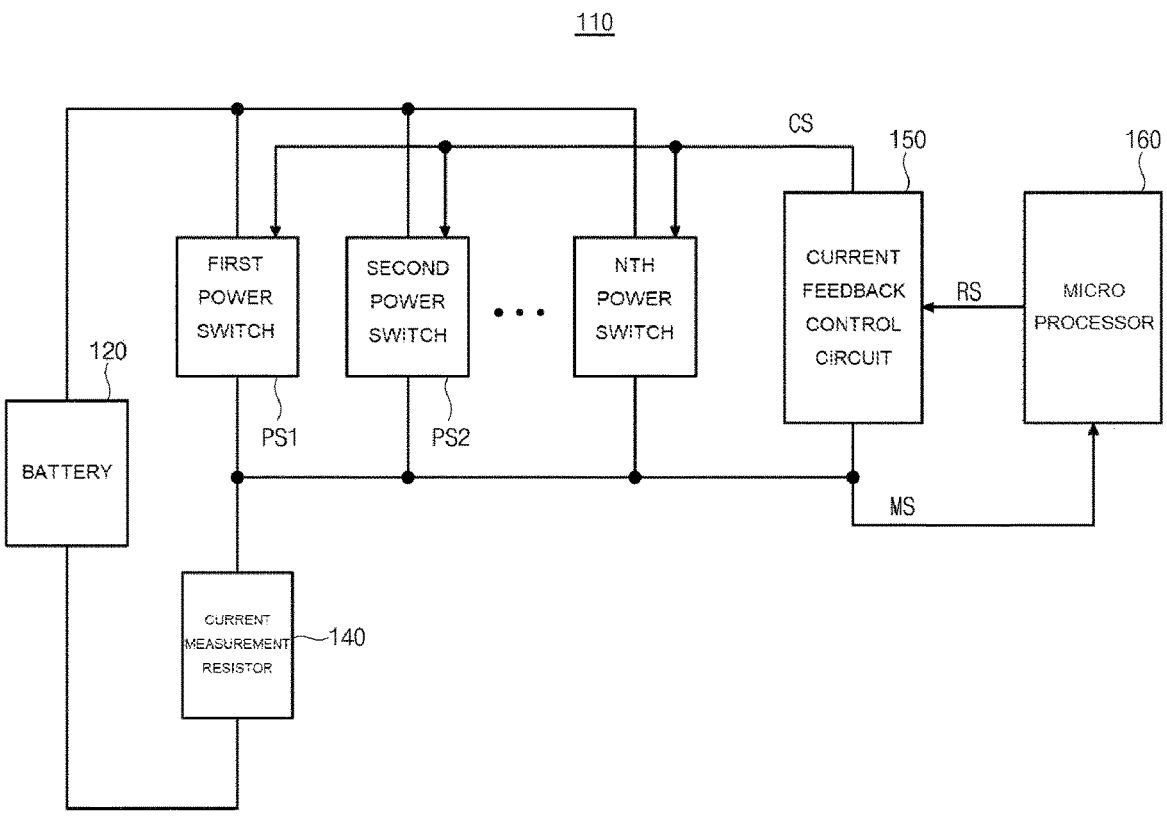
FIG. 1 is a view illustrating a current control-type battery discharging apparatus according to a first embodiment of the present disclosure.

FIG. 1 is a view illustrating a current control-type battery discharging apparatus according to a first embodiment of the present disclosure.

Referring to FIG. 1, a current control-type battery discharging apparatus 110 according to the first embodiment of the present disclosure includes a battery 120, a plurality of power switches 130, a current measurement resistor 140, a current feedback control circuit 150, and a microprocessor 160.

Specifically, a positive electrode and a negative electrode of the battery 120 for discharging after use may be respectively connected to the plurality of power switches 130 and the current measurement resistor 140.

The plurality of power switches 130 may be connected between the battery 120 and the current measurement resistor 140 in parallel and switching-controlled according to a control signal CS of the current feedback control circuit 150 to adjust a current amount of discharging currents flowing from the positive electrode to the negative electrode of the battery 120, and as a result, the plurality of power switches 130 may convert the remaining power of the battery 120 to heat and discharge the heat.

For example, the plurality of power switches 130 may include first to nth power switches PS1 to PSn, each of which is one of a transistor TR, a field effect transistor FET, and an insulated gate bipolar transistor IGBT.

Each of the plurality of power switches 130 may include a gate electrode, a drain electrode, and a source electrode, wherein the gate electrodes may be connected to the current feedback control circuit 150 to receive the control signal CS, the drain electrodes may be connected to the positive electrode of the battery 120, and the source electrodes may be connected to one end of the current measurement resistor 140.

The current measurement resistor 140 is connected between the plurality of power switches 130 and the battery 120 and is used to measure the current amount of the discharging currents flowing through the plurality of power switches 130 between the positive electrode and the negative electrode of the battery 120, wherein one end of the current measurement resistor 140 may be connected to the plurality of power switches 130, and the other end of the current measurement resistor 140 may be connected to the negative electrode of the battery 120.

The current feedback control circuit 150 is connected to one electrode of each of the plurality of power switches 130 to apply the control signal CS, is connected to connection nodes between the plurality of power switches 130 and the current measurement resistor 140 to measure a voltage, calculates the discharging currents from voltage values of the connection nodes and a resistance value of the current measurement resistor 140, and transmits a measurement signal MS corresponding to the discharging currents to the microprocessor 160.

For example, the current feedback control circuit 150 may control the plurality of power switches 130 using the control signal CS corresponding to the turn-on of the plurality of power switches 130 when the discharging currents flowing through the plurality of power switches 130 are lower than a reference current corresponding to a reference signal RS, and may control the plurality of power switches 130 using the control signal CS corresponding to the turn-off of the plurality of power switches 130 when the discharging currents flowing through the plurality of power switches 130 are greater than or equal to the reference current corresponding to the reference signal RS.

The microprocessor 160 receives the measurement signal MS from the current feedback control circuit 150, calculates the reference signal RS in which the measurement signal MS is reflected, and transmits the reference signal RS to the current feedback control circuit 150.

In the current control-type battery discharging apparatus 110 according to the first embodiment, the microprocessor

160 calculates the reference signal RS using the measurement signal MS corresponding to the discharging currents, the current feedback control circuit 150 calculates the control signal CS using the reference signal RS of the microprocessor 160, and the plurality of power switches 130 are switching-controlled according to the control signal CS of the current feedback control circuit 150 so that the discharging currents flow, and as a result, the remaining power of the battery 120 is converted to heat and discharged.

Meanwhile, the plurality of power switches 130 may have a difference in characteristics, and when the plurality of power switches 130 are controlled by one control signal CS of one current feedback control circuit 150, the discharging currents flowing through the plurality of power switches 130 may become different, and thus an imbalance in heat generation amounts of the plurality of power switches 130 may occur due to a characteristic difference between the plurality of power switches 130.

Further, when the imbalance in heat generation amounts becomes severe, the plurality of power switches 130 may be damaged, and when some of the plurality of power switches 130 are damaged, it is difficult to check the damaged power switches as the plurality of power switches 130 are connected in parallel, and when there is a short circuit of the damaged power switches, a discharging control function of the current control-type battery discharging apparatus 110 may be lost.

In another embodiment, a plurality of power switches may be independently controlled using a plurality of current feedback control circuits, and this will be described with reference to the drawings.

Figure 2:
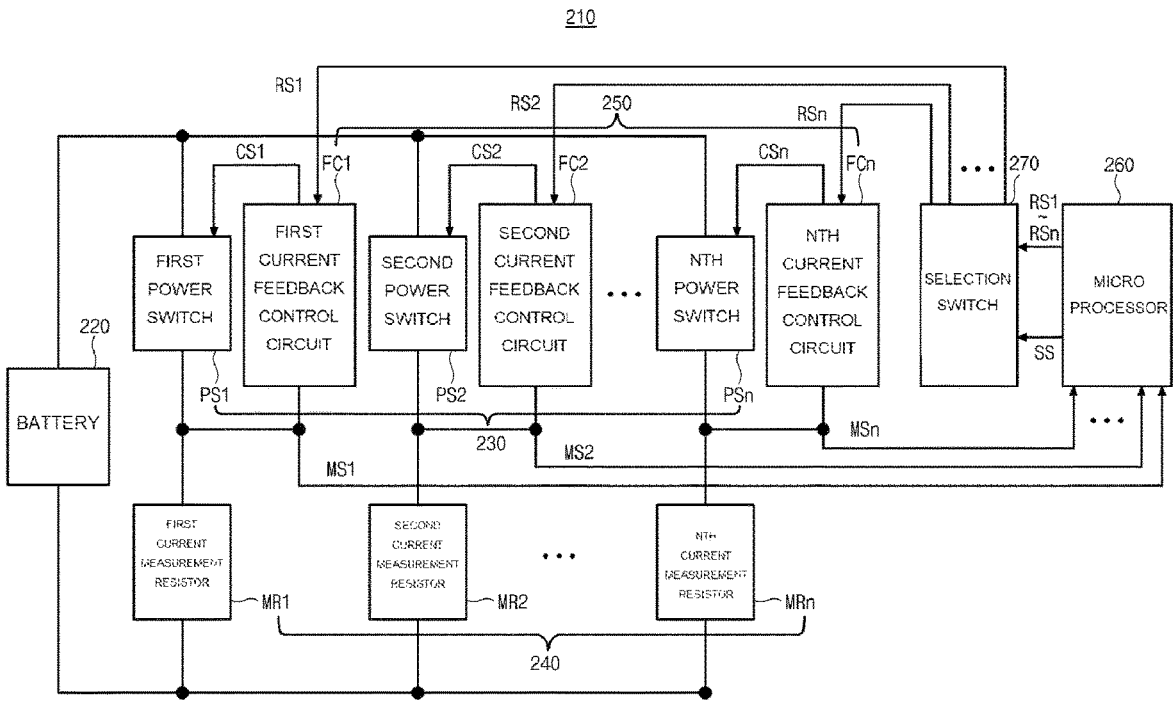
FIG. 2 is a view illustrating a current control-type battery discharging apparatus according to a second embodiment of the present disclosure.

FIG. 2 is a view illustrating a current control-type battery discharging apparatus according to a second embodiment of the present disclosure.

As shown in FIG. 2, a current control-type battery discharging apparatus 210 according to the second embodiment of the present disclosure includes a battery 220, a plurality of power switches 230, a plurality of current measurement resistors 240, a plurality of current feedback control circuits 250, a microprocessor 260, and a selection switch 270.

Specifically, a positive electrode and a negative electrode of the battery 220 for discharging after use may be respectively connected to the plurality of power switches 230 and the plurality of current measurement resistors 240.

The plurality of power switches 230 may be connected between the battery 220 and the current measurement resistors 240 and switching-controlled according to a plurality of control signals (first to nth control signals CS1 to CSn) of the plurality of current feedback control circuits 250 to adjust a current amount of discharging currents flowing from the positive electrode to the negative electrode of the battery 220, and as a result, the plurality of power switches 230 may convert the remaining power of the battery 220 to heat and discharge the heat.

For example, the plurality of power switches 230 may include first to nth power switches PS1 to PSn, each of which is one of a transistor TR, a field effect transistor FET, and an insulated gate bipolar transistor IGBT.

Each of the plurality of power switches 230 may include a gate electrode, a drain electrode, and a source electrode, wherein the gate electrodes may be respectively connected to the plurality of current feedback control circuits 250 to respectively receive the plurality of control signals CS1 to CSn, the drain electrodes may be connected to the positive electrode of the battery 120, and the source electrodes may be respectively connected to one ends of the plurality of current measurement resistors 240.

The plurality of current measurement resistors 240 are connected between the plurality of power switches 230 and the battery 220 and are used to measure the current amount of the discharging currents flowing through the plurality of power switches 230 between the positive electrode and the negative electrode of the battery 220, wherein one ends of the plurality of current measurement resistors 240 may be respectively connected to the plurality of power switches 230, and the other ends of the plurality of current measurement resistors 240 may be connected to the negative electrode of the battery 220.

For example, the plurality of current measurement resistors 240 may include first to nth current measurement resistors MR1 to MRn respectively connected to first to nth power switches PS1 to PSn.

The plurality of current feedback control circuits 250 are respectively connected to one electrodes of the plurality of power switches 230, apply a plurality of control signals CS1 to CSn in which a plurality of reference signals RS1 to RSn are reflected to the plurality of power switches 230, are respectively connected to connection nodes between the plurality of power switches 230 and the plurality of current measurement resistors 240 to measure a voltage, calculate a plurality of discharging currents flowing through the plurality of power switches 230 from voltage values of the connection nodes and resistance values of the plurality of current measurement resistors 240, and transmit a plurality of measurement signals (first to nth measurement signals MS1 to MSn) corresponding to the plurality of discharging currents to the microprocessor 260.

For example, the plurality of current feedback control circuits 250 may control the plurality of power switches 230 using the plurality of control signals CS1 to CSn corresponding to the turn-on of the plurality of power switches 230 when the plurality of discharging currents flowing through the plurality of power switches 230 are lower than a plurality of reference currents corresponding to the plurality of reference signals RS1 to RSn, respectively, and may control the plurality of power switches 230 using the plurality of control signals CS1 to CSn corresponding to the turn-off of the plurality of power switches 230 when the plurality of discharging currents flowing through the plurality of power switches 230 are greater than or equal to the plurality of references currents corresponding to the plurality of reference signals RS1 to RSn, respectively.

To this end, the plurality of current feedback control circuits 250 may include first to nth current feedback control circuits FC1 to FCn respectively connected to the first to nth power switches PS1 to PSn.

The microprocessor 260 receives the plurality of measurement signals MS1 to MSn from the plurality of current feedback control circuits 250, calculates the plurality of reference signals (first to nth reference signals RS1 to RSn) in which the plurality of measurement signals MS1 to MSn are reflected, and transmits the plurality of reference signals RS1 to RSn to the selection switch 270 along with a selection signal SS.

The selection switch 270 receives the plurality of reference signals RS1 to RSn and the selection signal SS from the microprocessor 260, is connected to the plurality of current feedback control circuits 250, and respectively transmits the plurality of reference signals RS1 to RSn to the plurality of current feedback control circuits 250 according to the selection signal SS.

In the current control-type battery discharging apparatus 210 according to the second embodiment, the microprocessor 260 calculates the plurality of reference signals RS1 to RSn using the plurality of measurement signals MS1 to MSn corresponding to the plurality of discharging currents, the plurality of current feedback control circuits 250 calculate the plurality of control signals CS1 to CSn using the plurality of reference signals RS1 to RSn of the microprocessor 260, and the plurality of power switches 230 are independently switching-controlled according to the plurality of control signals CS1 to CSn of the plurality of current feedback control circuits 250 so that the plurality of discharging currents flow independently, and as a result, the remaining power of the battery 220 is converted to heat and discharged.

Further, even when the plurality of power switches 230 have a difference in characteristics, since the plurality of power switches 230 are independently controlled using the plurality of control signals CS1 to CSn of plurality of current feedback control circuits 250, the plurality of discharging currents flowing through the plurality of power switches 230 may be maintained substantially the same, and an imbalance in heat generation amounts of the plurality of power switches 230 may be prevented to maintain uniform heat generation amounts.

In addition, damage to the plurality of power switches 230 due to the imbalance in heat generation amounts may be minimized, and when some of the plurality of power switches 230 are damaged, the damaged power switches 230 may be checked using the plurality of measurement signals MS1 to MSn, and a discharging control function of the current control-type battery discharging apparatus 210 may be maintained by selectively operating the undamaged power switches 230 through the selection switch 270, and as a result, stability is improved and a lifespan is increased.

The present disclosure has an effect in that stability is improved and a lifespan is increased by respectively connecting a plurality of current feedback control circuits to a plurality of power switches to independently control the plurality of power switches.

What is claimed is:

1. A current control-type battery discharging apparatus comprising:
  a plurality of power switches connected to one terminal of a battery;
  at least one current feedback control circuit configured to apply at least one control signal to the plurality of power switches;
  at least one current measurement resistor connected to the plurality of power switches and the other terminal of the battery; and
  a microprocessor configured to supply at least one reference signal to the at least one current feedback control circuit,
  wherein:
  the plurality of power switches include first to nth power switches;
  the at least one current feedback control circuit includes first to nth current feedback control circuits respectively connected to the first to nth power switches;
  the at least one current measurement resistor includes first to nth current measurement resistors respectively connected to the first to nth power switches; and
  the first to nth current feedback control circuits calculate first to nth discharging currents, respectively, flowing through the first to nth power switches, respectively.

2. The current control-type battery discharging apparatus of claim 1, wherein: the at least one current feedback control circuit transmits at least one measurement signal corresponding to discharging currents of the plurality of power switches to the microprocessor; and the microprocessor transmits the at least one reference signal corresponding to the at least one measurement signal to the at least one current feedback control circuit.

3. The current control-type battery discharging apparatus of claim 2, wherein the at least one current feedback control circuit controls the discharging currents of the plurality of power switches using the at least one control signal corresponding to the at least one reference signal.

4. The current control-type battery discharging apparatus of claim 1 wherein: the at least one control signal includes first to nth control signals respectively applied to the first to nth power switches; and the at least one reference signal includes first to nth reference signals respectively transmitted to the first to nth current feedback control circuits.

5. The current control-type battery discharging apparatus of claim 4, further comprising a selection switch connected between the microprocessor and the first to nth current feedback control circuits.

6. The current control-type battery discharging apparatus of claim 5, wherein:

the first to nth current feedback control circuits transmit first to nth measurement signals corresponding to the first to nth discharging currents, respectively, of the first to nth power switches to the microprocessor;

the microprocessor transmits the first to nth reference signals corresponding to the first to nth measurement signals, respectively, and a selection signal to the selection switch; and the selection switch respectively transmits the first to nth reference signals to the first to nth current feedback control circuits according to the selection signal.

7. The current control-type battery discharging apparatus of claim 6, wherein the first to nth current feedback control circuits respectively control the first to nth discharging currents of the first to nth power switches using the first to nth control signals corresponding to the first to nth reference signals.

8. The current control-type battery discharging apparatus of claim 1, wherein the first to nth current feedback control circuits:

are connected to first to nth connection nodes, respectively, between the first to nth power switches and the first to nth current measurement resistors to measure voltages of the first to nth connection nodes; and calculate the first to nth discharging currents from the voltages of the first to nth connection nodes and resistances of the first to nth current measurement resistors.

* * * * *